United States Patent [19]

Fox

[11] Patent Number: 4,970,458
[45] Date of Patent: Nov. 13, 1990

[54] AC VOLTAGE SENSING FOR VOLTAGE REGULATORS

[75] Inventor: David A. Fox, Shawnee Township, Allen County, Ohio

[73] Assignee: Westinghouse Electric Corp., Pittsburgh, Pa.

[21] Appl. No.: 349,016

[22] Filed: May 8, 1989

[51] Int. Cl.$^5$ .................. G01R 19/02; G01R 19/16
[52] U.S. Cl. .................. 324/132; 324/103 P; 324/107
[58] Field of Search ............ 324/158 MG, 132, 107, 324/119, 140 R, 103 P, 142; 328/28, 144; 307/529, 261; 322/22, 25; 364/483

[56] References Cited

U.S. PATENT DOCUMENTS

| | | | |
|---|---|---|---|
| 3,201,688 | 8/1965 | Ferguson | 324/132 |
| 4,044,296 | 8/1977 | Dhyanchand et al. | 322/25 |
| 4,166,245 | 8/1979 | Roberts | 324/103 P |
| 4,422,040 | 12/1983 | Raider et al. | 324/158 MG |
| 4,446,417 | 5/1984 | Fox et al. | 322/25 |
| 4,642,564 | 2/1987 | Hurley | 324/132 |
| 4,705,969 | 11/1987 | Gross | 328/144 |
| 4,807,106 | 2/1989 | Baker et al. | 322/25 |
| 4,811,236 | 3/1989 | Brennen et al. | 364/483 |

Primary Examiner—Reinhard J. Eisenzopf
Assistant Examiner—Vinh P. Nguyen
Attorney, Agent, or Firm—R. P. Lenart

[57] ABSTRACT

A voltage-sensing circuit producing a voltage-indicating signal representative of the voltages in a three-phase AC system produces several voltage-indicating signals which are representative of the phase voltages in a three-phase AC system. These voltage-indicating signals are squared, and the squared voltages are summed to produce an output signal having a DC voltage component with a magnitude proportional to the Mean Square value of the AC phase voltages. Unbalanced voltages in the three-phase system can be monitored by detecting the peak value of a ripple voltage imposed on the DC voltage component of the output of the circuit.

4 Claims, 2 Drawing Sheets

AC VOLTAGE SENSING FOR VOLTAGE REGULATORS

BACKGROUND OF THE INVENTION

This invention relates to AC voltage sensing and, more particularly, to voltage regulator sensing circuits which sense three-phase voltage, and the sensing method employed by the circuits.

Typical electric generator voltage regulators include a sensing circuit which senses high power AC voltage derived from the generator output and produces a DC output signal proportional to the sensed voltage. The sensing circuit output signal is subtracted from a reference signal to develop an error signal proportional to the difference between the actual generator output and a desired generator output. A voltage regulator feedback control loop is used to adjust the exciter field current of the generator in response to the error signal.

Recent designs of control circuits and amplifiers have improved the operation of voltage regulators to a point where their performance is limited only by the voltage sensing circuit. The two critical requirements for the sensing circuits are accuracy and fast response to transients. In the type of electrical power system typically found on aircraft, constant speed generator systems have used half-wave peak rectifier sensing circuits. Variable speed constant frequency systems have used half-wave average circuits. The use of true RMS or true Mean Square sensing circuits is under consideration.

Half-wave peak rectifier circuits are simple, but their accuracy depends on the waveform crest factor. Such circuits respond quickly to step increases in voltage (at least when the next positive peak occurs) but cannot respond to decreases in voltage faster than the discharge rate of the circuit.

Half-wave average sensing circuits add three half-wave currents to develop a signal with the appearance of the output of a three-phase full-wave rectifier. Such circuits respond to the average of the waveform which gives better regulation, but only sense the positive half-cycles. Half-wave sensing can cause modulation problems.

Both peak and average sensing circuits are inherently electromagnetic-interference susceptible because of their non-linear operation. These circuits include diodes in the signal path which tend to detect the high frequency electromagnetic interference and upset voltage regulation. The diodes must be compensated by adding temperature-dependent resistors to the circuit. Good compensation can only be accomplished at two discrete temperatures, with errors occurring over the rest of the temperature range.

True RMS or Mean Square sensing requires the use of squaring and averaging circuits. Such averaging circuits have inherently slow response, but the regulation is ideal. Such circuits are used in some true RMS meters.

In order to improve voltage regulator performance, a better sensing circuit that combines fast response with the accuracy of true RMS sensing is required.

SUMMARY OF THE INVENTION

Circuits for producing a voltage-indicating signal representative of the voltages in a three-phase AC system which are constructed in accordance with this invention, produce voltage-indicating signals which are representative of the phase voltages in a three-phase system, square each of the voltage-indicating signals, and sum the squared signals to produce an output signal having a DC voltage component with a magnitude proportional to the Mean Square value of the phase voltages.

Unbalanced conditions in the three-phase AC system produce a ripple voltage on the DC voltage component. This ripple voltage can be detected to monitor the unbalanced phase voltages.

This invention encompasses both circuits for producing a voltage indicating signal representative of the voltages in a three-phase AC system and the voltage sensing method employed by those circuits. Such circuits contribute to improve voltage regulation over the typical operating speed, load, and temperature ranges experienced by aircraft power systems.

DESCRIPTION OF THE PREFERRED EMBODIMENTS

Figure 1:
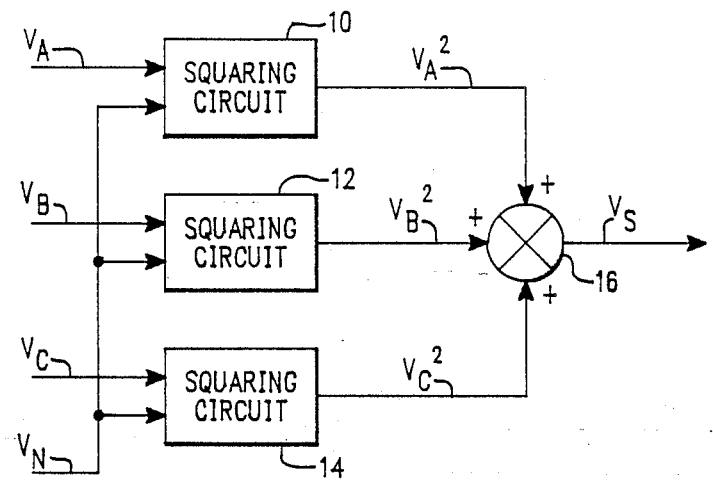
FIG. 1 is a block diagram of a circuit constructed in accordance with one embodiment of the present invention.

Referring to the drawings, FIG. 1 is a block diagram of a voltage regulator sensing circuit constructed in accordance with the present invention. A plurality of voltage-indicating signals $V_A$, $V_B$, $V_C$, and $V_N$, representative of the voltages in a four-wire, three-phase AC system, are applied to the inputs of squaring circuits 10, 12, and 14 as indicated. The outputs of the squaring circuits are combined in summation point 16 to produce an output signal $V_S$. This output signal includes a DC voltage component having a magnitude that is proportional to the Mean Square value of the phase voltages of the AC system.

It is well known that a balanced set of three-phase voltages delivers constant power to a linear load. Mathematically, this can be represented by:

$$\frac{V_A^2}{R} + \frac{V_B^2}{R} + \frac{V_C^2}{R} = \text{Constant} \quad (1)$$

If:
$$V_A = V_P \sin \omega t \quad (2)$$
$$V_B = V_P \sin(\omega t - 120°) \quad (3)$$
$$V_C = V_P \sin(\omega t + 120°) \quad (4)$$
Then:
$$V_A^2 + V_B^2 + V_C^2 = \frac{3}{2} V_P^2 = \text{Constant} \quad (5)$$

Where $V_A$, $V_B$, and $V_C$ are the phase-to-neutral voltages in the AC systems, R is the load resistance, and $V_P$ is the peak phase voltage.

Figure 2:
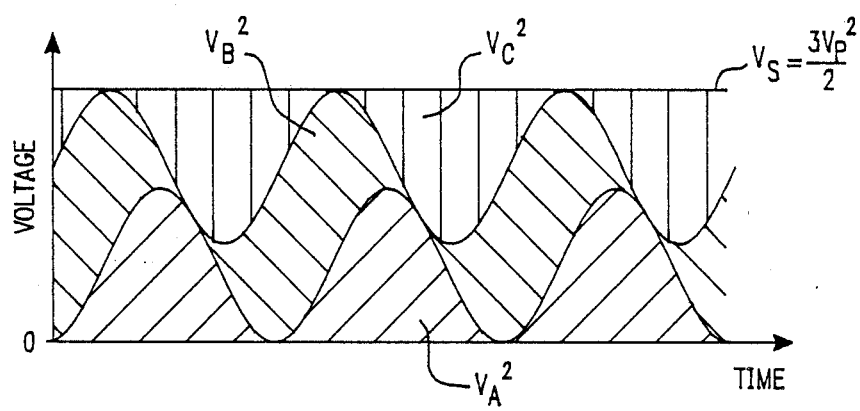
FIG. 2 is a waveform diagram which illustrates the operation of the circuit of FIG. 1.

Squaring each of the phase voltages produces a DC component plus a double frequency component. FIG. 2 shows how these components add up to produce a DC value.

Harmonic distortion on the phase voltages will cause ripple on the $V_S$ output, but the DC component of $V_S$ is always proportional to the square of the root mean square value of the phase voltages. The response of the circuit of FIG. 1 is instantaneous since no averaging or filtering is done to slow it down.

Figure 3:
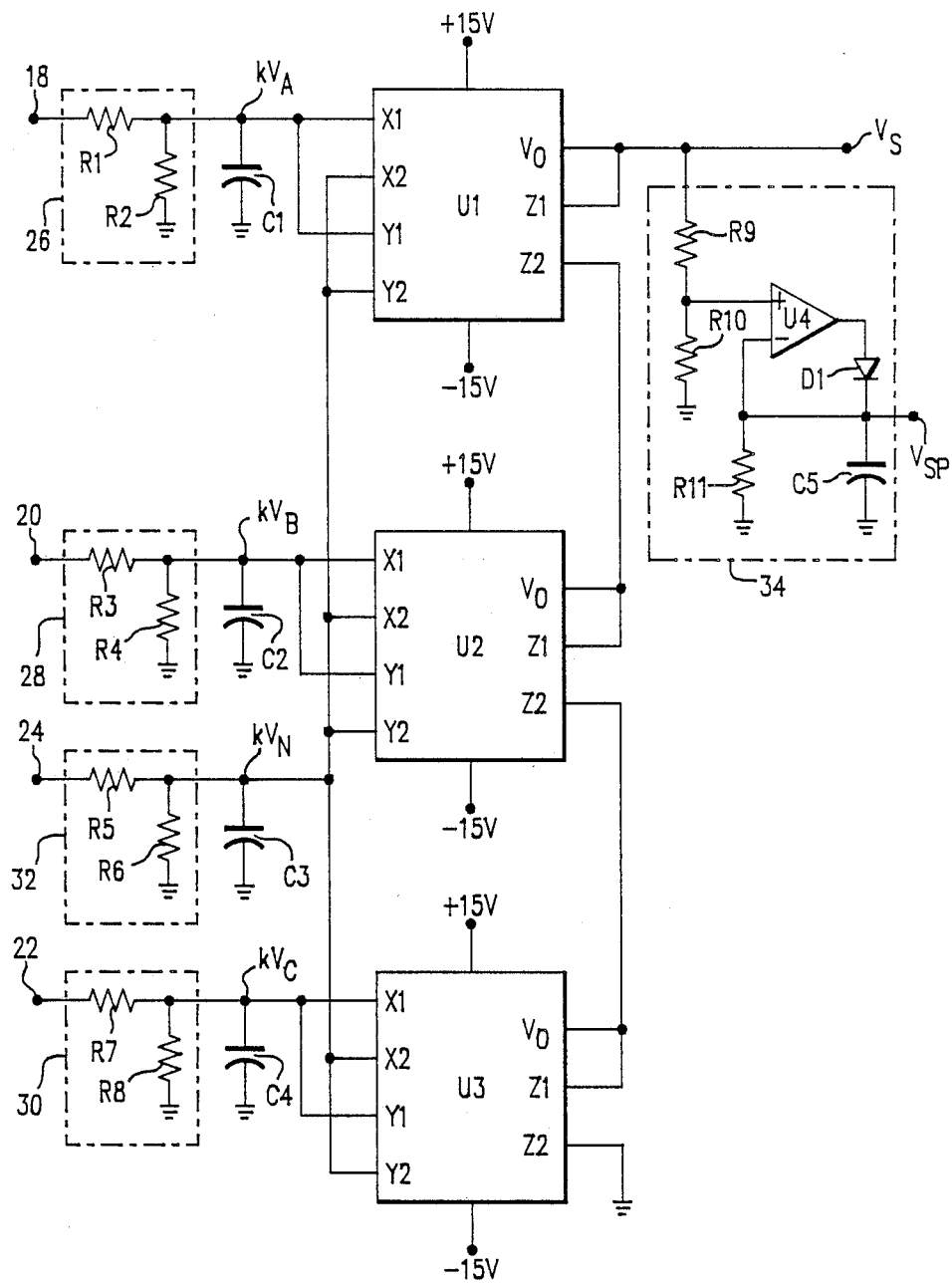
FIG. 3 is a schematic diagram of a preferred embodiment of the present invention.

The circuit of FIG. 3 implements the sum of squares concept illustrated in FIGS. 1 and 2. U1, U2, and U3 are commercially available integrated circuit multipliers and summers with high impedance differential inputs. With the connections as shown, the output of each multiplier is given by:

$$V_O = \frac{(X1 - X2)(Y1 - Y2)}{10} + Z2 \quad (6)$$

Terminals 18, 20, 22, and 24 are electrically connected to phase A, phase B, phase C, and the neutral of the four-wire, three-phase AC system being monitored. Four identical voltage dividers 26, 28, 30, and 32 connect a fraction, k, of three-phase voltages $V_A$, $V_B$, $V_C$, and the neutral voltage $V_N$ to the inputs of the multipliers. The outputs of the multipliers are connected in series so that the resulting sense voltage $V_S$ is given by:

$$V_S = \frac{K^2}{10}[(V_A - V_N)^2 + (V_B - V_N)^2 + (V_C - V_N)^2] \quad (7)$$

Capacitors C1, C2, C3, and C4 have been added to limit the bandwidth of the input signals applied to the multipliers. This will reduce electromagnetic interference susceptibility.

Unbalanced load conditions cause unbalanced phase voltages on three-phase systems. It is a common requirement to limit the highest phase voltage to a specified level for these conditions. A peak-detecting circuit 34, comprising resistors R9, R10, and R11; diode D1; capacitor C5; and, amplifier U4, has been added to perform this function. Unbalanced phase voltages will cause a ripple in the $V_S$ output. The peak-detecting circuit will detects peaks of this ripple and produce an output signal $V_{SP}$ having a magnitude proportional to the peak ripple voltage. This output signal can be used in accordance with known feedback control techniques to limit the highest phase voltage.

It should now be apparent that the present invention encompasses both a circuit for sensing three-phase AC voltages and the sensing method performed by that circuit. This invention provides instantaneous response to transients. The circuit of FIG. 3 utilizes differential line-to-neutral sensing which is immune to large common mode voltages. Its linear input impedance provided by resistive voltage dividers reduces electromagnetic interference susceptibility. Temperature compensation is inherent in the circuit design. The circuit is also relatively insensitive to poor total harmonic distortion or unbalanced voltages in the system being monitored. By sensing the total waveform, the sensing circuit is not half-cycle sensitive.

Although the present invention has been described in terms of what is at present believed to be its preferred embodiment, it will be apparent to those skilled in the art that various changes may be made without departing from the scope of the invention. It is therefore intended that the appended claims cover such changes.

What is claimed is:

1. A method of producing a voltage indicating signal representative of the voltages in a three phase AC system, said method comprising the steps of:
   producing a plurality of voltage indicating signals, each of said voltage indicating signals being representative of a phase voltage in a three phase AC system;
   squaring each of said voltage indicating signals
   summing the squared voltage indicating signals to product an output signal having a DC voltage component with a magnitude proportional to the squares of the root mean square values of said phase voltages; and
   producing a second output signal representative of a peak value of a ripple voltage imposed on said DC voltage component.

2. A circuit for producing a voltage indicating signal representative of the voltages in a three phase AC system, said circuit comprising;
   means for producing a plurality of voltage indicating signals, each of said voltage indicating signals being representative of a phase voltage in a three phase AC system;
   means for squaring each of said voltage indicating signals;
   means for summing the squared voltage indicating signals to produce an output signal having a DC voltage component with a magnitude proportional to the squares of the root mean square values of said phase voltages; and
   means for producing a second output signal representative of a peak value of a ripple voltage imposed on said DC voltage component.

3. A circuit for producing a voltage indicating signal representative of the voltages in a three phase AC system, said circuit comprising:
   first, second and third multiplying and summing circuits, each having first, second, third, fourth and fifth input terminals and an output terminal, wherein each of said circuits produces an output voltage at the output terminal which is proportional to the product of the difference voltages between said first and second terminals and said third and fourth terminals plus the voltage on said fifth terminal;
   means for connecting said first, and third terminals of each of said circuits to one phase of an AC voltage to be sensed;
   means for connecting said second and fourth terminals of each of said circuits to a neutral of said AC voltage to be sensed;
   means for connecting said fifth terminal of said first circuit to the output terminal of a second one of said circuits; and
   means for connecting said fifth terminal of said second circuit to said output terminal of said third circuit, whereby the voltage at said output terminal of said first circuit includes a DC voltage component which is proportional to the squares of the too mean square value of said phase voltages.

4. The circuit of claim 3, further comprising:
   means for producing a second output signal representative of a peak value of a ripple voltage imposed on said DC voltage component.

* * * * *